US011955422B2

(12) United States Patent
Xue et al.

(10) Patent No.: US 11,955,422 B2
(45) Date of Patent: Apr. 9, 2024

(54) ON-CHIP CAPACITORS IN SEMICONDUCTOR DEVICES AND METHODS FOR FORMING THE SAME

(71) Applicant: YANGTZE MEMORY TECHNOLOGIES CO., LTD., Wuhan (CN)

(72) Inventors: Lei Xue, Wuhan (CN); Wei Liu, Wuhan (CN); Liang Chen, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 17/488,287

(22) Filed: Sep. 28, 2021

(65) Prior Publication Data

US 2022/0068797 A1    Mar. 3, 2022

Related U.S. Application Data

(60) Division of application No. 17/147,409, filed on Jan. 12, 2021, now Pat. No. 11,652,042, which is a
(Continued)

(30) Foreign Application Priority Data

Sep. 2, 2020  (WO) ................ PCT/CN2020/112959
Sep. 2, 2020  (WO) ................ PCT/CN2020/112962

(51) Int. Cl.
*H01L 23/522*   (2006.01)
*H01L 21/768*   (2006.01)
(Continued)

(52) U.S. Cl.
CPC .... *H01L 23/5223* (2013.01); *H01L 21/76832* (2013.01); *H01L 28/40* (2013.01);
(Continued)

(58) Field of Classification Search
CPC .......... H01L 23/5223; H01L 21/76832; H01L 27/1157; H01L 27/11582; H01L 28/40; H01L 28/56
See application file for complete search history.

(56) References Cited

U.S. PATENT DOCUMENTS 9,082,555 B2   7/2015  Kwong
9,876,031 B1   1/2018  Shimizu et al.
(Continued)

FOREIGN PATENT DOCUMENTS

CN   102969313 A   3/2013
CN   111566815 A   8/2020
TW   202029515 A   8/2020

OTHER PUBLICATIONS

International Search Report issued in corresponding International Application No. PCT/CN2020/128709, dated May 27, 2021, 4 pages.

*Primary Examiner* — Ahmed N Sefer
(74) *Attorney, Agent, or Firm* — BAYES PLLC

(57) ABSTRACT

Embodiments of semiconductor devices and methods for forming the same are disclosed. In an example, a semiconductor device includes at least one dielectric layer pair including a first dielectric layer and a second dielectric layer different from the first dielectric layer, an interlayer dielectric (ILD) layer in contact with the at least one dielectric layer pair, and one or more capacitors each extending vertically through the ILD layer and in contact with the at least one dielectric layer pair.

15 Claims, 11 Drawing Sheets

Related U.S. Application Data continuation of application No. PCT/CN2020/128709, filed on Nov. 13, 2020.

(51) Int. Cl.
  *H01L 49/02* (2006.01)
  *H10B 43/27* (2023.01)
  *H10B 43/35* (2023.01)

(52) U.S. Cl.
  CPC ............ *H01L 28/56* (2013.01); *H10B 43/27* (2023.02); *H10B 43/35* (2023.02)

(56) References Cited

U.S. PATENT DOCUMENTS

| | | |
|---|---|---|
| 10,147,732 B1 | 12/2018 | Hu et al. |
| 10,629,675 B1 | 4/2020 | Nishikawa et al. |
| 2013/0049086 A1 | 2/2013 | Ahn et al. |
| 2016/0172113 A1* | 6/2016 | Reig ................ H01G 7/06 361/278 |
| 2016/0336311 A1 | 11/2016 | Kim |
| 2016/0365351 A1* | 12/2016 | Nishikawa ......... G11C 16/0483 |
| 2017/0103980 A1* | 4/2017 | Fornara ................ H01L 21/768 |
| 2018/0082168 A1* | 3/2018 | Marukame ............ G06N 3/065 |
| 2018/0151587 A1* | 5/2018 | Son ................ H01L 27/249 |
| 2018/0151589 A1 | 5/2018 | Shimizu et al. |
| 2019/0006458 A1* | 1/2019 | Chan ................ H01L 21/76224 |
| 2021/0013303 A1* | 1/2021 | Chen .................... H01L 23/642 |
| 2021/0043643 A1* | 2/2021 | Lu .................... H01L 27/11548 |

* cited by examiner

200

ON-CHIP CAPACITORS IN SEMICONDUCTOR DEVICES AND METHODS FOR FORMING THE SAME

CROSS-REFERENCE TO RELATED APPLICATIONS

This application is a divisional of U.S. application Ser. No. 17/147,409, filed on Jan. 12, 2021, entitled "ON-CHIP CAPACITORS IN SEMICONDUCTOR DEVICES AND METHODS FOR FORMING THE SAME," which is a continuation of International Application No. PCT/CN2020/128709, filed on Nov. 13, 2020, entitled "ON-CHIP CAPACITORS IN SEMICONDUCTOR DEVICES AND METHODS FOR FORMING THE SAME," which claims the benefit of priorities to International Application No. PCT/CN2020/112959, filed on Sep. 2, 2020, entitled "ON-CHIP CAPACITOR STRUCTURES IN SEMICONDUCTOR DEVICES," and International Application No. PCT/CN2020/112962, filed on Sep. 2, 2020, entitled "METHODS FOR FORMING ON-CHIP CAPACITOR STRUCTURES IN SEMICONDUCTOR DEVICES," all of which are incorporated herein by reference in their entireties.

BACKGROUND

Embodiments of the present disclosure relate to semiconductor devices and fabrication methods thereof.

Integrate circuits technology allows creating many types of devices on the silicon die. The most common devices are transistors, diodes, resistors, or capacitors. Capacitors are elements that are used in semiconductor devices for storing an electrical charge. Capacitors include two conductive plates separated by an insulating material. Capacitors are used in applications such as electronic filters, analog-to-digital converters, memory devices, control applications, and many other types of semiconductor device applications.

Various types of capacitor designs have been used in integrating on-chip capacitors to reduce the die-area occupied by the capacitors and increase the capacitance density, including, for example, metal-insulator-metal (MIM) capacitors, metal-oxide-metal (MOM) capacitors, metal-oxide-semiconductor (MOS) capacitors, metal fringe capacitors, trench capacitors, and junction capacitors, to name a few.

SUMMARY

Embodiments of semiconductor devices and methods for forming the same are disclosed herein.

In one example, a semiconductor device includes at least one dielectric layer pair including a first dielectric layer and a second dielectric layer different from the first dielectric layer, an interlayer dielectric (ILD) layer in contact with the at least one dielectric layer pair, and one or more capacitors each extending vertically through the ILD layer and in contact with the at least one dielectric layer pair.

In another example, a three-dimensional (3D) memory device includes a semiconductor layer, a memory stack on one side of the semiconductor layer, and a plurality of first contacts disposed in a peripheral region of the 3D memory device outside of the memory stack. The memory stack includes a plurality of conductive/dielectric layer pairs each including a conductive layer and a first dielectric layer.

In still another example, a method for forming a 3D memory device is disclosed. A dielectric stack is formed above a substrate. The dielectric stack includes a plurality of dielectric layer pairs each including a first dielectric layer and a second dielectric layer different from the first dielectric layer. The dielectric stack is etched to form a staircase structure in a device region, leaving at least one dielectric layer pair in a peripheral region. An ILD layer is formed on the at least one dielectric layer pair in the peripheral region. A plurality of first contacts each extending vertically through the ILD layer are formed above and in contact with the at least one dielectric layer pair.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
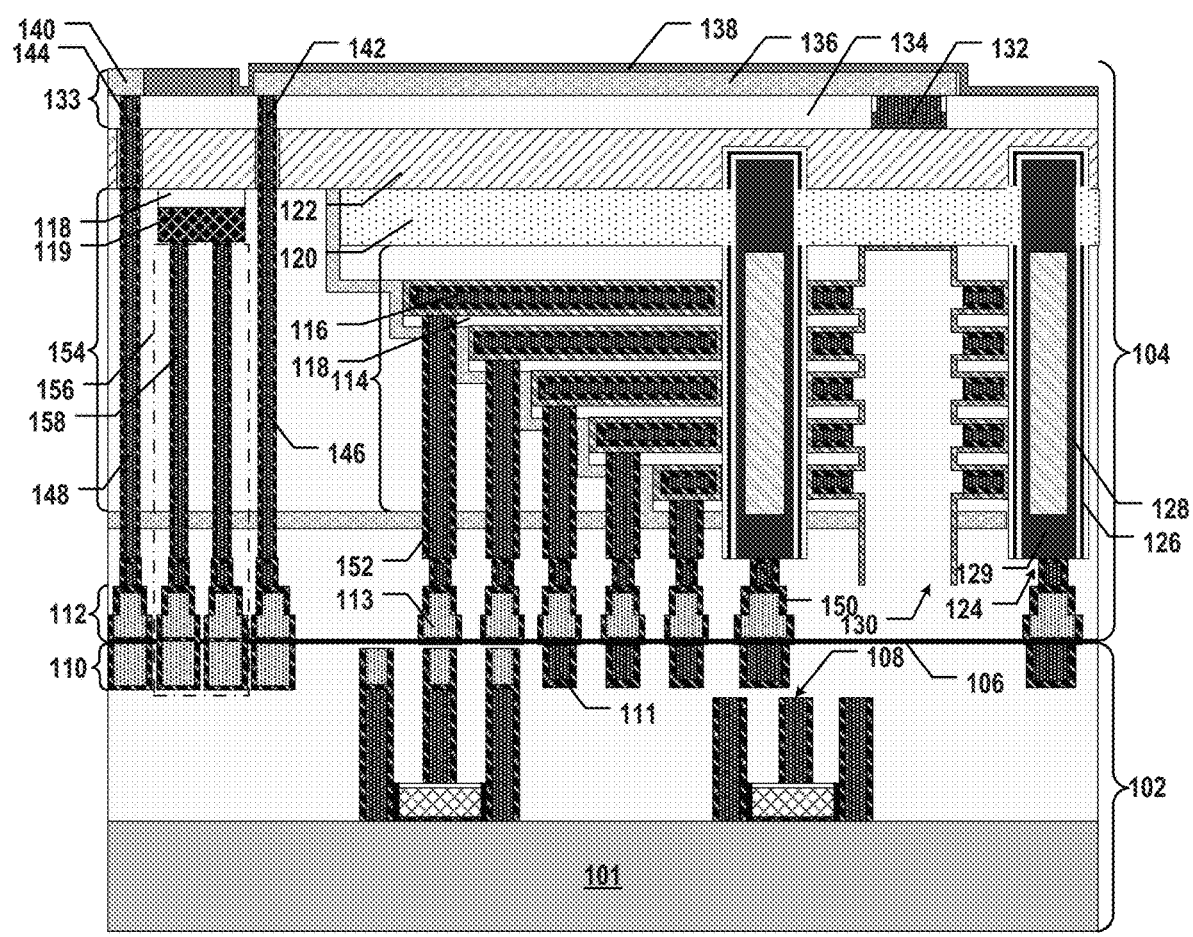
FIG. 1 illustrates a side view of a cross-section of an exemplary 3D memory device having on-chip capacitors, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means "above" or "over" something but can also include the meaning that it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region, of a homogeneous or inhomogeneous continuous structure, that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or vertical interconnect access (VIA) contacts are formed) and one or more dielectric layers.

As used herein, the term "nominal/nominally" refers to a desired, or target, value of a characteristic or parameter, for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some semiconductor devices, such as NAND Flash memory devices, on-chip capacitors are formed in the peripheral circuits. As capacitors are the bulkiest devices in the peripheral circuits, the conventional designs of on-chip capacitors limit the shrinkage of the die area of the perioral circuits as well as the flexibility of the metal routing. In particular, for some 3D semiconductor devices in which multiple chips are stacked, the large area of on-chip capacitors even on one chip can limit the shrinkage of the entire device size.

Various embodiments in accordance with the present disclosure provide a novel design of on-chip capacitors in 3D semiconductor devices. By utilizing an ILD layer with large thickness as the capacitor dielectric, the capacitor structure can extend vertically to reduce its planar size. The on-chip capacitors can be used in the memory array chip of a 3D NAND Flash memory device, which already has a thick ILD layer outside of the memory stack and has its thickness continuously increasing as the level of memory stack increases. As a result, the capacitance density of the on-chip capacitors can be increased without increasing the planar die size, and the metal routing of the semiconductor devices can be simplified as well. In some embodiments, one or more dielectric layer pairs, which are part of the dielectric stack replaced by the memory stack in the 3D memory device, are used for landing the capacitor electrodes and electrically separating the on-chip capacitors from the silicon substrate (either in its native thickness or after thinning). The formation of the dielectric layer pair(s) can be achieved using the same trim-etch processes that form the staircase structures of the dielectric stack/memory stack, without introducing additional fabrication complexity and cost.

FIG. 1 illustrates a side view of a cross-section of an exemplary 3D memory device 100 having on-chip capacitors, according to some embodiments of the present disclosure. 3D memory device 100 may be one example of a semiconductor device having on-chip capacitors disclosed herein. In some embodiments, 3D memory device 100 is a bonded chip including a first semiconductor structure 102 and a second semiconductor structure 104 stacked over first semiconductor structure 102. First and second semiconductor structures 102 and 104 are joined at a bonding interface 106 therebetween, according to some embodiments. As shown in FIG. 1, first semiconductor structure 102 can include a substrate 101, which can include silicon (e.g., single crystalline silicon, c-Si), silicon germanium (SiGe), gallium arsenide (GaAs), germanium (Ge), silicon on insulator (SOI), or any other suitable materials.

First semiconductor structure 102 of 3D memory device 100 can include peripheral circuits 108 on substrate 101. It is noted that x-, y-, and z-axes are included in FIG. 1 to illustrate the spatial relationships of the components in 3D memory device 100. Substrate 101 includes two lateral surfaces extending laterally in the x-y plane: a front surface on the front side of the wafer, and a back surface on the backside opposite to the front side of the wafer. The x- and y-directions are two orthogonal directions in the wafer plane: x-direction is the word line direction, and the y-direction is the bit line direction. The z-axis is perpendicular to both the x- and y-axes. As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 101) in the z-direction (the vertical direction perpendicular to the x-y plane) when the substrate is positioned in the lowest plane of the semiconductor device in the z-direction. The same notion for describing spatial relationships is applied throughout the present disclosure.

In some embodiments, peripheral circuit 108 is configured to control and sense the 3D memory device 100. Peripheral circuit 108 can be any suitable digital, analog, and/or mixed-signal control and sensing circuits used for facilitating the operation of 3D memory device 100 including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). Peripheral circuits 108 can include transistors formed "on" substrate 101, in which the entirety or part of the transistors are formed in substrate 101 (e.g., below the top surface of substrate 101) and/or directly on substrate 101. Isolation regions (e.g., shallow trench isolations (STIs)) and doped regions (e.g., source regions and drain regions of the transistors) can be formed in substrate 101 as well. The transistors are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some embodiments. It is understood that in some embodiments, peripheral circuit 108 may further include any other circuits compatible with the advanced logic processes including logic circuits, such as processors and programmable logic devices (PLDs) or memory circuits, such as static random-access memory (SRAM). For example, the devices of first semiconductor structure 102 may be formed using complementary metal-oxide-semiconductor (CMOS) compatible processes and thus, may be referred to herein as a "CMOS chip."

In some embodiments, first semiconductor structure 102 of 3D memory device 100 further includes an interconnect layer (not shown) above peripheral circuits 108 to transfer electrical signals to and from peripheral circuits 108. The interconnect layer can include a plurality of interconnects (also referred to herein as "contacts"), including lateral interconnect lines and VIA contacts. As used herein, the term "interconnects" can broadly include any suitable types of interconnects, such as middle-end-of-line (MEOL) interconnects and back-end-of-line (BEOL) interconnects. The interconnect layer can further include one or more interlayer dielectric (ILD) layers (also known as "intermetal dielectric (IMD) layers") in which the interconnect lines and VIA contacts can form. That is, the interconnect layer can include interconnect lines and VIA contacts in multiple ILD layers. The interconnect lines and VIA contacts in the interconnect layer can include conductive materials including, but not limited to, tungsten (W), cobalt (Co), copper (Cu), aluminum (Al), silicides, or any combination thereof. The ILD layers in the interconnect layer can include dielectric materials including, but not limited to, silicon oxide, silicon nitride, silicon oxynitride, low dielectric constant (low-k) dielectrics, or any combination thereof.

As shown in FIG. 1, first semiconductor structure 102 of 3D memory device 100 can further include a bonding layer 110 at bonding interface 106 and above the interconnect layer and peripheral circuits 108. Bonding layer 110 can include a plurality of bonding contacts 111 and dielectrics electrically isolating bonding contacts 111. Bonding contacts 111 can include conductive materials including, but not limited to, W, Co, Cu, Al, silicides, or any combination thereof. The remaining area of bonding layer 110 can be formed with dielectrics including, but not limited to, silicon oxide, silicon nitride, silicon oxynitride, low-k dielectrics, or any combination thereof. Bonding contacts 111 and surrounding dielectrics in bonding layer 110 can be used for hybrid bonding.

Similarly, as shown in FIG. 1, second semiconductor structure 104 of 3D memory device 100 can also include a bonding layer 112 at bonding interface 106 and above bonding layer 110 of first semiconductor structure 102. Bonding layer 112 can include a plurality of bonding contacts 113 and dielectrics electrically isolating bonding contacts 113. Bonding contacts 113 can include conductive materials including, but not limited to, W, Co, Cu, Al, silicides, or any combination thereof. The remaining area of bonding layer 112 can be formed with dielectrics including, but not limited to, silicon oxide, silicon nitride, silicon oxynitride, low-k dielectrics, or any combination thereof. Bonding contacts 113 and surrounding dielectrics in bonding layer 112 can be used for hybrid bonding. Bonding contacts 113 are in contact with bonding contacts 111 at bonding interface 106, according to some embodiments.

As described below in detail, second semiconductor structure 104 can be bonded on top of first semiconductor structure 102 in a face-to-face manner at bonding interface 106. In some embodiments, bonding interface 106 is disposed between bonding layers 110 and 112 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 106 is the place at which bonding layers 112 and 110 are met and bonded. In practice, bonding interface 106 can be a layer with a certain thickness that includes the top surface of bonding layer 110 of first semiconductor structure 102 and the bottom surface of bonding layer 112 of second semiconductor structure 104.

In some embodiments, second semiconductor structure 104 of 3D memory device 100 further includes an interconnect layer (not shown) above bonding layer 112 to transfer electrical signals. The interconnect layer can include a plurality of interconnects, such as MEOL interconnects and BEOL interconnects. The interconnect layer can further include one or more ILD layers in which the interconnect lines and VIA contacts can form. The interconnect lines and VIA contacts in the interconnect layer can include conductive materials including, but not limited to, W, Co, Cu, Al, silicides, or any combination thereof. The ILD layers in the interconnect layer can include dielectric materials including, but not limited to, silicon oxide, silicon nitride, silicon oxynitride, low-k dielectrics, or any combination thereof.

In some embodiments, 3D memory device 100 is a NAND Flash memory device in which memory cells are provided in the form of an array of NAND memory strings. As shown in FIG. 1, second semiconductor structure 104 of 3D memory device 100 can include an array of channel structures 124 functioning as the array of NAND memory strings. For example, second semiconductor structure 104 may be referred to herein as a "memory array chip." As shown in FIG. 1, each channel structure 124 can extend vertically through a plurality of conductive/dielectric layer pairs 116/118 each including a conductive layer 116 and a dielectric layer 118. The stack of conductive/dielectric layer pairs 116/118 forms a memory stack 114, according to some embodiments. The number of conductive/dielectric layer pairs 116/118 in memory stack 114 (e.g., 32, 64, 96, 128, 160, 192, 224, 256, or more) determines the number of memory cells in 3D memory device 100. It is understood that in some embodiments, memory stack 114 may have a multi-deck architecture (not shown), which includes a plurality of memory decks stacked over one another. The numbers of conductive/dielectric layer pairs 116/118 in each memory deck can be the same or different.

Memory stack 114 can include a plurality of vertically interleaved conductive layers 116 and dielectric layers 118. Conductive layers 116 and dielectric layers 118 in memory stack 114 can alternate in the vertical direction. In other words, except the ones at the top or bottom of memory stack 114, each conductive layer 116 can be adjoined by two dielectric layers 118 on both sides, and each dielectric layer 118 can be adjoined by two conductive layers 116 on both sides. Conductive layers 116 can include conductive materials including, but not limited to, W, Co, Cu, Al, polysilicon, doped silicon, silicides, or any combination thereof. Each conductive layer 116 can include a gate electrode (gate line) surrounded by an adhesive layer and a gate dielectric layer. The gate electrode of conductive layer 116 can extend laterally as a word line, ending at one or more staircase structures of memory stack 114. Dielectric layers 118 can include dielectric materials including, but not limited to, silicon oxide, silicon nitride, silicon oxynitride, or any combination thereof.

As shown in FIG. 1, second semiconductor structure 104 of 3D memory device 100 can also include a first semiconductor layer 120 above memory stack 114 and a second semiconductor layer 122 above and in contact with first semiconductor layer 120. In some embodiments, each of first and second semiconductor layers 120 and 122 is an N-type doped semiconductor layer, e.g., a silicon layer doped with N-type dopant(s), such as phosphorus (P) or arsenic (As). In some embodiments, first semiconductor layer 120 can be formed above a substrate by thin film deposition and/or epitaxial growth. In contrast, second semiconductor layer 122 can be a thinned substrate, for example, including single crystalline silicon.

In some embodiments, each channel structure 124 includes a channel hole filled with a semiconductor layer (e.g., as a semiconductor channel 128) and a composite dielectric layer (e.g., as a memory film 126). In some embodiments, semiconductor channel 128 includes silicon, such as amorphous silicon, polysilicon, or single crystalline silicon. In some embodiments, memory film 126 is a composite layer including a tunneling layer, a storage layer (also known as a "charge trap layer"), and a blocking layer. The remaining space of channel structure 124 can be partially or fully filled with a capping layer including dielectric materials, such as silicon oxide, and/or an air gap. Channel structure 124 can have a cylinder shape (e.g., a pillar shape).

The capping layer, semiconductor channel 128, the tunneling layer, storage layer, and blocking layer of memory film 126 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, memory film 126 can include a composite layer of silicon oxide/silicon oxynitride/silicon oxide (ONO).

In some embodiments, channel structure 124 further includes a channel plug 129 in the bottom portion (e.g., at the lower end) of channel structure 124. As used herein, the "upper end" of a component (e.g., channel structure 124) is the end farther away from substrate 101 in the z-direction, and the "lower end" of the component (e.g., channel structure 124) is the end closer to substrate 101 in the z-direction when substrate 101 is positioned in the lowest plane of 3D memory device 100. Channel plug 129 can include semiconductor materials (e.g., polysilicon). In some embodiments, channel plug 129 functions as the drain of the NAND memory string.

As shown in FIG. 1, each channel structure 124 can extend vertically through interleaved conductive layers 116 and dielectric layers 118 of memory stack 114 and first semiconductor layer 120. In some embodiments, first semiconductor layer 120 surrounds part of channel structure 124 and is in contact with semiconductor channel 128 including polysilicon. That is, memory film 126 is disconnected at part of channel structure 124 that abuts first semiconductor layer 120, exposing semiconductor channel 128 to be in contact with the surrounding first semiconductor layer 120, according to some embodiments. In some embodiments, each channel structure 124 can extend vertically further into second semiconductor layer 122, e.g., a thinned substrate. That is, each channel structure 124 extends vertically through memory stack 114. As shown in FIG. 1, the top portion (e.g., the upper end) of channel structures 124 is in second semiconductor layer 122, according to some embodiments.

As shown in FIG. 1, second semiconductor structure 104 of 3D memory device 100 can further include insulating structures 130 each extending vertically through interleaved conductive layers 116 and dielectric layers 118 of memory stack 114. Each insulating structure 130 can also extend laterally to separate channel structures 124 into a plurality of blocks. That is, memory stack 114 can be divided into a plurality of memory blocks by insulating structures 130, such that the array of channel structures 124 can be separated into each memory block. In some embodiments, each insulating structure 130 includes an opening (e.g., a slit) filled with one or more dielectric materials, including, but not limited to, silicon oxide, silicon nitride, silicon oxynitride, or any combination thereof. In one example, each insulating structure 130 may be filled with silicon oxide.

3D memory device 100 can include a backside source contact 132 above memory stack 114 and in contact with second semiconductor layer 122, as shown in FIG. 1. Source contact 132 and memory stack 114 (and insulating structure 130 therethrough) can be disposed at opposite sides of second semiconductor layer 122 (e.g., a thinned substrate) and thus, viewed as a "backside" source contact. In some embodiments, source contact 132 is electrically connected to first semiconductor layer 120 and semiconductor channel 128 of channel structure 124 through second semiconductor layer 122. In some embodiments in which second semiconductor layer 122 includes an N-well, source contact 132 is also referred to herein as an "N-well pick up." Source contacts 132 can include any suitable types of contacts. In some embodiments, source contacts 132 include a VIA contact. In some embodiments, source contacts 132 include a wall-shaped contact extending laterally. Source contact 132 can include one or more conductive layers, such as a metal layer (e.g., W, Co, Cu, or Al) or a silicide layer surrounded by an adhesive layer (e.g., titanium nitride (TiN)).

As shown in FIG. 1, 3D memory device 100 can further include a BEOL interconnect layer 133 above and in contact with source contact 132 for pad-out, e.g., transferring electrical signals between 3D memory device 100 and external circuits. In some embodiments, interconnect layer 133 includes an ILD layer 134 on second semiconductor layer 122 and a redistribution layer 136 on ILD layer 134. The upper end of source contact 132 is flush with the top surface of ILD layer 134 and the bottom surface of redistribution layer 136, and source contact 132 extends vertically through ILD layer 134 to be in contact with second semiconductor layer 122, according to some embodiments. ILD layer 134 in interconnect layer 133 can include dielectric materials including, but not limited to, silicon oxide, silicon nitride, silicon oxynitride, low-k dielectrics, or any combination thereof. It is understood that ILD layer 134 may include multiple sublayers in some examples, such as one or more silicon oxide layers and one or more silicon nitride layers. Redistribution layer 136 in interconnect layer 133 can include conductive materials including, but not limited to, W, Co, Cu, Al, silicides, or any combination thereof. In one example, redistribution layer 136 includes Al. In some embodiments, interconnect layer 133 further includes a passivation layer 138 as the outmost layer for passivation and protection of 3D memory device 100. Part of redistribution layer 136 can be exposed from passivation layer 138 as contact pads 140. That is, interconnect layer 133 of 3D memory device 100 can also include contact pads 140 for wire bonding and/or bonding with an interposer.

In some embodiments, second semiconductor structure 104 of 3D memory device 100 further includes contacts 142 and 144 through second semiconductor layer 122. As second semiconductor layer 122 can be a thinned substrate, contacts 142 and 144 are through substrate contacts (TSCs), according to some embodiments. In some embodiments, contact 142 extends through second semiconductor layer 122 and ILD layer 134 to be in contact with redistribution layer 136, such that first semiconductor layer 120 is electrically connected to contact 142 through second semiconductor layer 122, source contact 132, and redistribution layer 136 of interconnect layer 133. In some embodiments, contact 144 extends through second semiconductor layer 122 and ILD layer 134 to be in contact with contact pad 140. Contacts 142 and 144 each can include one or more conductive layers, such as a metal layer (e.g., W, Co, Cu, or Al) or a silicide layer surrounded by an adhesive layer (e.g., TiN). In some embodiments, at least contact 144 further includes a spacer (e.g., a dielectric layer) to electrically insulate contact 144 from second semiconductor layer 122.

In some embodiments, 3D memory device 100 further includes peripheral contacts 146 and 148 each extending vertically through an ILD layer 154 to be in contact with second semiconductor layer 122 (e.g., an N-well of a P-type silicon substrate) outside of memory stack 114. ILD layer 154 can have the thickness equal to or greater than the thickness of memory stack 114. Each peripheral contact 146 or 148 can have a depth equal to or greater than the thickness of memory stack 114 to extend vertically from bonding layer 112 to second semiconductor layer 122 in a peripheral region that is outside of memory stack 114. In some embodiments, peripheral contact 146 is below and in contact with contact 142, such that first semiconductor layer 120 is electrically connected to peripheral circuit 108 in first semiconductor structure 102 through at least second semiconductor layer 122, source contact 132, interconnect layer 133, contact 142, and peripheral contact 146. In some embodiments, peripheral contact 148 is below and in contact with contact 144, such that peripheral circuit 108 in first semiconductor structure 102 is electrically connected to contact pad 140 for pad-out through at least contact 144 and peripheral contact 148. Peripheral contacts 146 and 148 each can include one or more conductive layers, such as a metal layer (e.g., W, Co, Cu, or Al) or a silicide layer surrounded by an adhesive layer (e.g., TiN).

As shown in FIG. 1, 3D memory device 100 also includes a variety of local contacts (also known as "C1 contacts") as part of the interconnect structure, which are in contact with a structure in memory stack 114 directly. In some embodiments, the local contacts include channel local contacts 150 each below and in contact with the lower end of a respective channel structure 124. Each channel local contact 150 can be electrically connected to a bit line contact (not shown) for bit line fan-out. In some embodiments, the local contacts further include word line contacts 152 each below and in contact with a respective conductive layer 116 (including a word line) of one conductive/dielectric layer pair 116/118 at the staircase structure of memory stack 114 for word line fan-out. Local contacts, such as channel local contacts 150 and word line contacts 152, can be electrically connected to peripheral circuits 108 of first semiconductor structure 102 through at least bonding layers 112 and 110. Local contacts, such as channel local contacts 150 and word line contacts 152, each can include one or more conductive layers, such as a metal layer (e.g., W, Co, Cu, or Al) or a silicide layer surrounded by an adhesive layer (e.g., TiN).

As shown in FIG. 1, by utilizing ILD layer 154 having the thickness equal to or greater than memory stack 114, second semiconductor structure 104 (e.g., the memory array chip) of 3D memory device 100 can include a capacitor 156 in the peripheral region outside of memory stack with a relatively large capacitance density and a relatively small planar size. Similar to ILD layer 134, ILD layer 154 can include dielectric materials including, but not limited to, silicon oxide, silicon nitride, silicon oxynitride, low-k dielectrics, or any combination thereof. It is understood that ILD layer 154 may include multiple sublayers in some examples, such as one or more silicon oxide layers and one or more silicon nitride layers. To accommodate the thickness of memory stack 114, the thickness of ILD layer 154 is relatively large, e.g., equal to or greater than the thickness of memory stack 114.

As shown in FIG. 1, a dielectric layer pair 118/119 including dielectric layer 118 and another dielectric layer 119 is below and in contact with second semiconductor layer 122 in the peripheral region for landing capacitor 156 and electrically separating capacitor 156 from second semiconductor layer 122 (e.g., an N-well of a thinned P-type silicon substrate). Dielectric layer 118 in dielectric layer pair 118/119 can have the same dielectric material of dielectric layer 118 in memory stack 114, and dielectric layer 119 can be different from dielectric layer 118, i.e., having a different dielectric material. In some embodiments, dielectric layer 118 includes silicon oxide, and dielectric layer 119 includes silicon oxide. It is understood that although only one dielectric layer pair 118/119 is shown in FIG. 1, multiple dielectric layer pairs 118/119 may be formed in other examples. In some embodiments, the thickness of dielectric layer pair 118/119 is nominally the same as the thickness of conductive/dielectric layer pair 116/118 as dielectric layer pair 118/119 and conductive/dielectric layer pairs 116/118 are formed from the same stack structure, as described below in detail with respect to the fabrication process. In some embodiments, dielectric layer pair 118/119 does not occupy the entire peripheral region, such that peripheral contacts 146 and 148 do not need to extend through dielectric layer pair 118/119 to be in contact with second semiconductor layer 122. That is, dielectric layer pair 118/119 is formed only in part of the peripheral region in which capacitor 156 lands, according to some embodiments.

ILD layer 154 can be formed on second semiconductor layer 122 (e.g., a thinned substrate) and dielectric layer pair 118/119 in the peripheral region and thus, below and in contact with second semiconductor layer 122 and dielectric layer pair 118/119, as shown in FIG. 1. Capacitor 156 also includes a pair of peripheral contacts 158 each extending vertically through ILD layer 154 and in contact with dielectric layer pair 118/119, according to some embodiments. The pair of peripheral contacts 158 thus can act as two capacitor electrodes laterally separated by a capacitor dielectric, i.e., part of ILD layer 154 laterally between the pair of peripheral contacts 158. In some embodiments, the pair of peripheral contacts 158 is a pair of parallel wall-shaped contacts each extending laterally, e.g., in the y-direction in FIG. 1, to further increase the size of the capacitor electrodes and dielectric and the resulting capacitance. The pair of peripheral contacts 158 can be electrically connected to at least one of peripheral circuits 108 in first semiconductor structure 102 (e.g., the peripheral chip). Similar to peripheral contacts 146 and 148, peripheral contacts 158 each can include one or more conductive layers, such as a metal layer (e.g., W, Co, Cu, or Al) or a silicide layer surrounded by an adhesive layer (e.g., TiN).

In some embodiments, some or all of the on-chip capacitors used by first semiconductor structure 102 (e.g., the CMOS chip) of 3D memory device 100 are formed in second semiconductor structure 104 (e.g., capacitors 156) as described above to reduce the die size of first semiconductor structure 102. Thus, second semiconductor structure 104 (e.g., the memory array chip) of 3D memory device 100 can have a plurality of capacitor 156 electrically connected to peripheral circuits 108 of first semiconductor structure 102 through the interconnect layers and bonding layers 110 and 112 to satisfy the needs of capacitors in peripheral circuits 108 of 3D memory device 100. Because of the naturally thick ILD layer 154 in the memory array chip, the capacitance density of capacitors 156 can be increased by extending the capacitor electrodes vertically without increasing the planar area of each capacitor 156, thereby reducing the overall die size of bonded 3D memory device 100.

Figure 2:
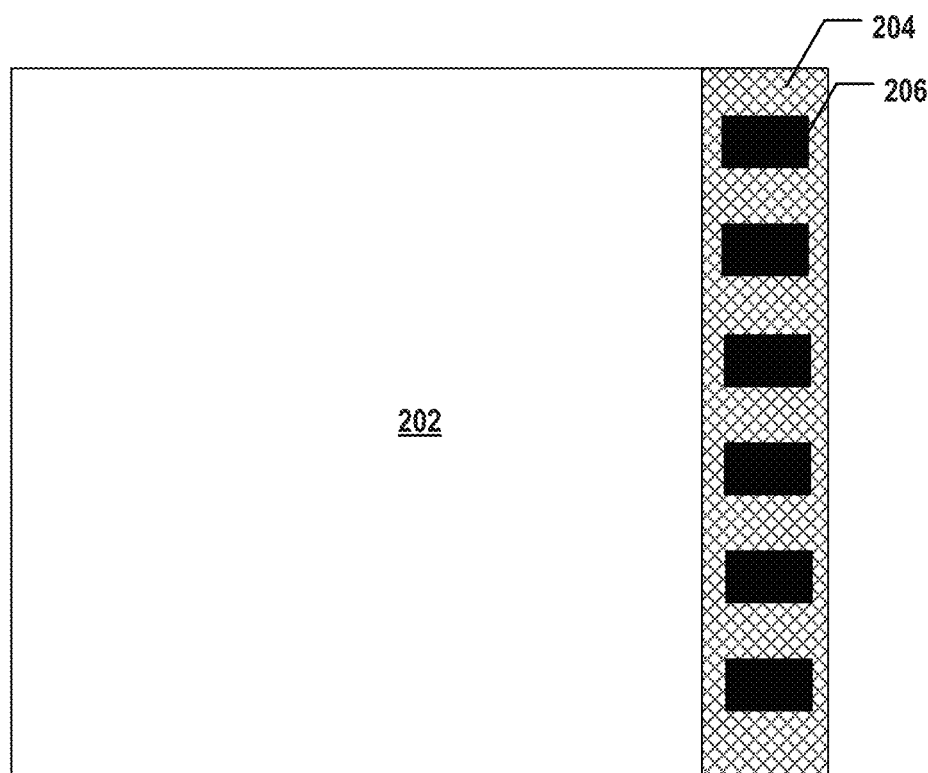
FIG. 2 illustrates a plan view of an exemplary 3D memory device having on-chip capacitors, according to some embodiments of the present disclosure.
Figure 2:
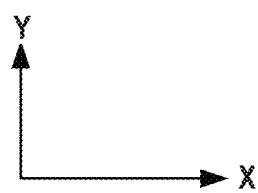

FIG. 2 illustrates a plan view of an exemplary 3D memory device 200 having on-chip capacitors, according to some embodiments of the present disclosure. 3D memory device 200 may be one example of 3D memory device 100 in FIG. 1, and FIG. 2 may illustrate a plan view of the backside of 3D memory device 100 in FIG. 1, according to some embodiments. As shown in FIG. 2, 3D memory device 200 can include a memory array chip, corresponding to second semiconductor structure 104 in 3D memory device 100 in FIG. 1, having a device region 202 in which the memory stack (and staircase structures thereof) and channel structures are formed, e.g., corresponding to memory stack 114 (and staircase structures thereof) and channel structures 124. The memory array chip of 3D memory device 200 can also include one or more peripheral regions 204 outside of device region 202 in which the memory stack is formed. Peripheral region 204 is at the edge of 3D memory device 200, according to some embodiments. In some embodiments, contact pads 206 are formed in peripheral region 204, corresponding to contact pads 140. The on-chip capacitors disclosed herein (e.g., capacitors 156 in FIG. 1) can be formed in the remaining area of peripheral region 204 without contact pads 206, which do not require extra space from the memory array chip of 3D memory device 200. The metal routing of 3D memory device 200 can be simplified as well due to the floorplan of the on-chip capacitors in peripheral regions 204 outside of device region 202 as well as the reduced planar sizes of the on-chip capacitor structures.

It is understood that, although capacitor 156 is illustrated in 3D memory device 100 in FIG. 1, the on-chip capacitors disclosed herein may be formed in any other suitable semiconductor devices, such as 3D semiconductor devices having a relatively thick ILD layer and a stack structure on the substrate. It is also understood that a 3D memory device in which capacitor 156 or any other on-chip capacitors disclosed herein is formed is not limited to the example of 3D memory device 100 in FIG. 1 and may have any suitable architectures that include a memory stack and an ILD layer outside of the memory stack and having the thickness equal to or greater than the thickness of the memory stack. It is further understood that the on-chip capacitors disclosed herein, such as capacitor 156 in FIG. 1, can serve any suitable functions in a semiconductor device, such as decoupling capacitors (also known as bypass capacitors) for decoupling one part of a circuit from another (e.g., to bypass the power supply or other high impedance components of a circuit to keep the voltage stable), coupling capacitors for blocking the DC signal on the transmission line, filter capacitors in electronic filters, etc.

Figure 3:
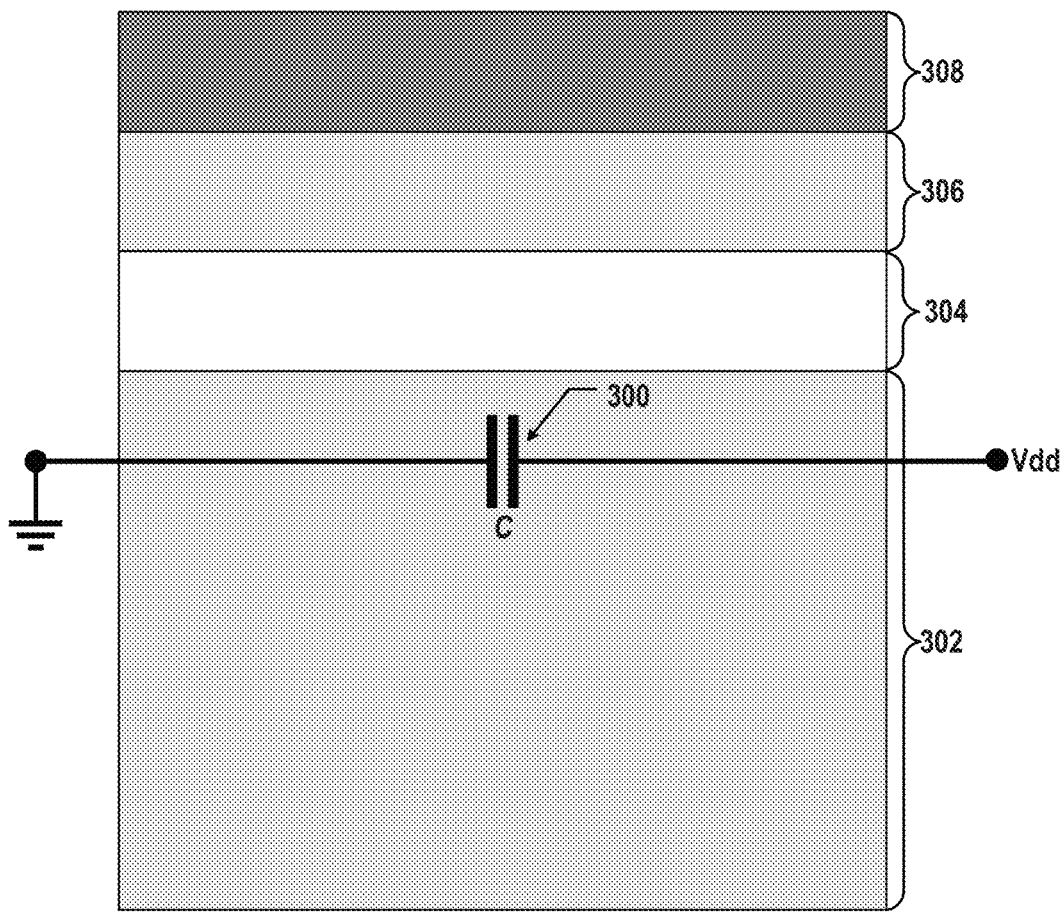
FIG. 3 illustrates a schematic diagram of an on-chip capacitor in a 3D semiconductor device, according to some embodiments of the present disclosure.
Figure 4A:
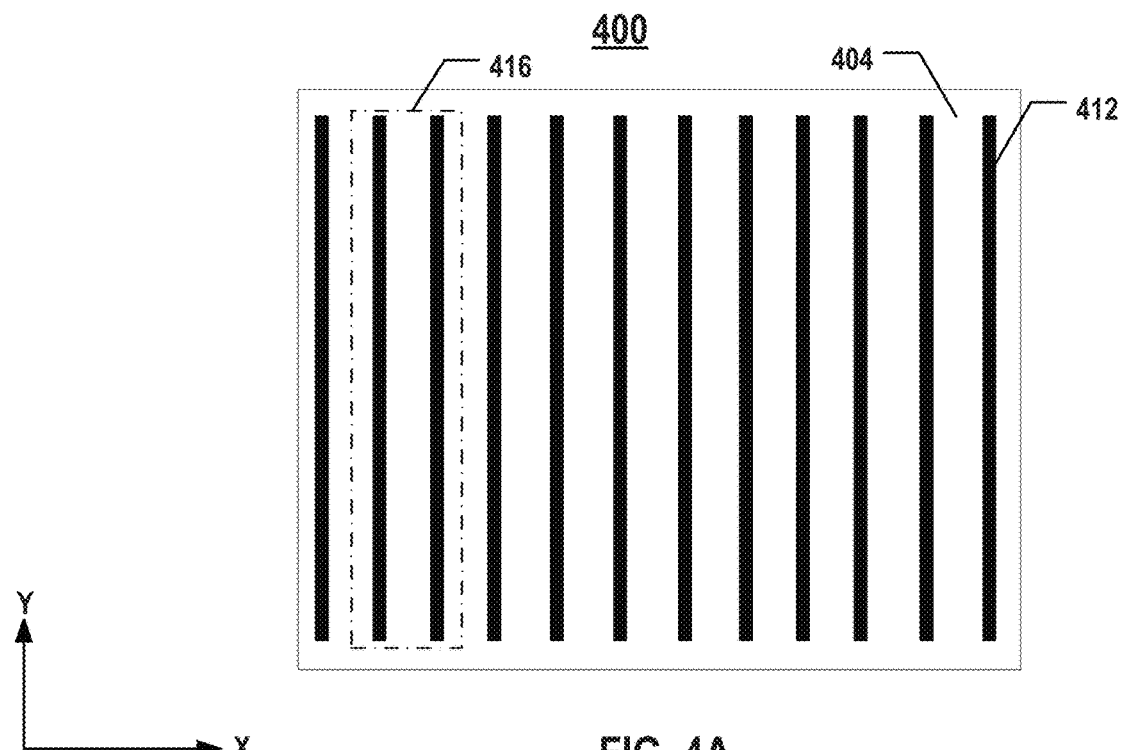
FIGS. 4A and 4B illustrate a plan view and a side view, respectively, of cross-sections of an exemplary 3D semiconductor device having on-chip capacitors, according to some embodiments of the present disclosure.
Figure 4B:
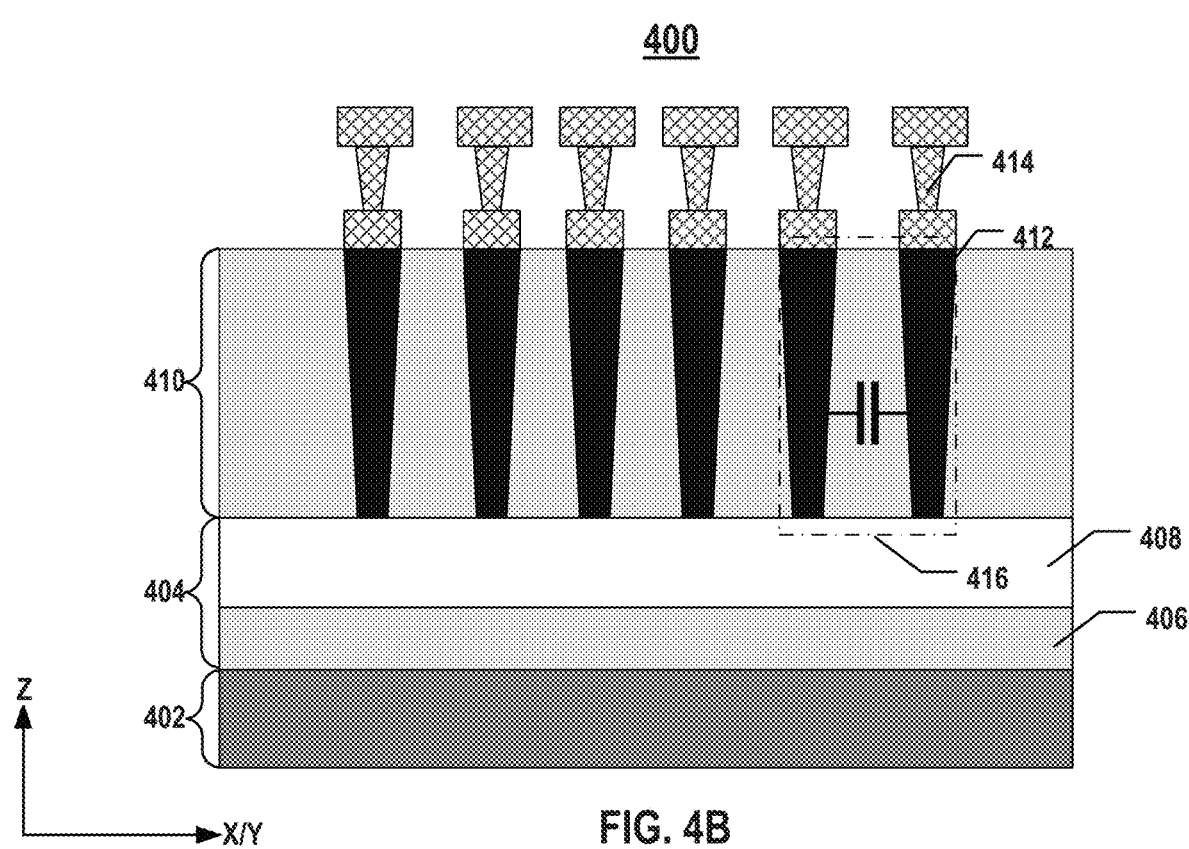
Figure 5:
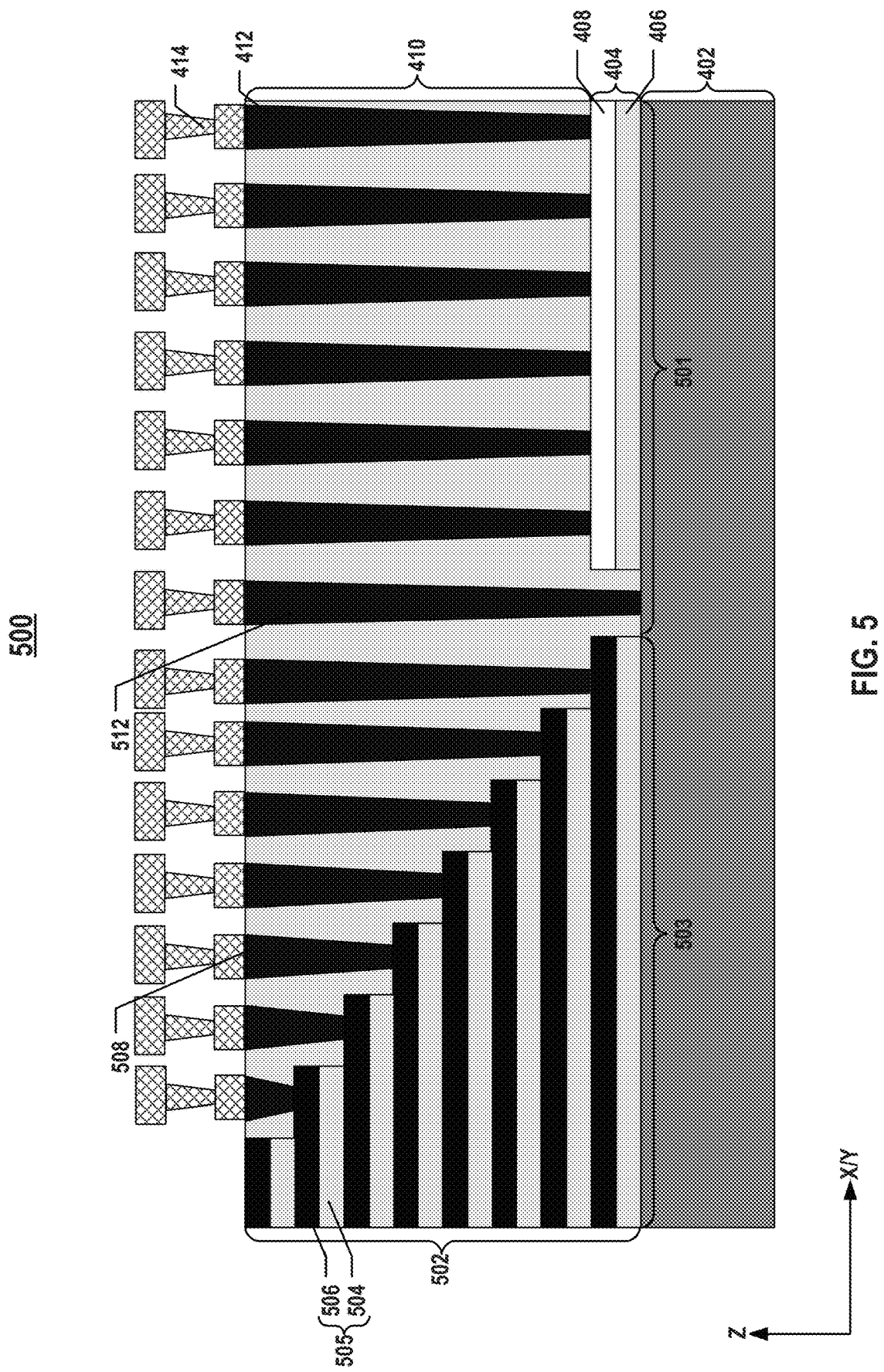
FIG. 5 illustrates a side view of a cross-section of an exemplary 3D memory device having on-chip capacitors, according to some embodiments of the present disclosure.

FIG. 3 illustrates a schematic diagram of an on-chip capacitor 300 in a 3D semiconductor device, according to some embodiments of the present disclosure. As shown in FIG. 3, the 3D semiconductor device, such as 3D memory device 100, can include an ILD layer 302, a first dielectric layer 304, a second dielectric layer 306, and a semiconductor layer 308. First and second dielectric layers 304 and 306 can be disposed between semiconductor layer 308 (e.g., a silicon substrate) and ILD layer 302, such as dielectric layer pair 118/119 disposed between second semiconductor layer 122 and ILD layer 154 in FIG. 1. Capacitor 300 can be formed based on ILD layer 302. In some embodiments, capacitor 300 is a decoupling capacitor electrically connected to the power line and the ground of the 3D semiconductor device. FIGS. 4A, 4B, and 5 below illustrate in detail various non-limiting examples of the designs for implementing capacitor 300.

FIGS. 4A and 4B illustrate a plan view and a side view, respectively, of cross-sections of an exemplary 3D semiconductor device 400 having on-chip capacitors, according to some embodiments of the present disclosure. 3D semiconductor device 400 can include a semiconductor layer 402 and a dielectric layer pair 404 in contact with semiconductor layer 402. In some embodiments, semiconductor layer 402 is a thinned substrate, such as a thinned silicon substrate, and dielectric layer pair 404 is formed on the front side of the thinned substrate. It is understood that the relative positions of the components in 3D semiconductor device 400, such as semiconductor layer 402 and dielectric layer pair 404, may be changed accordingly if 3D semiconductor device 400 is flipped upside down, such as second semiconductor structure 104 in 3D memory device 100 in FIG. 1.

Dielectric layer pair 404 can include a pair of a first dielectric layer 406 above and in contact with semiconductor layer 402 and a second dielectric layer 408 above and in contact with first dielectric layer 406. In some embodiments, second dielectric layer 408 is different from first dielectric layer 406, e.g., having different dielectric materials. In some embodiments, first dielectric layer 406 includes silicon oxide, and second dielectric layer 408 includes silicon nitride. The thickness of first dielectric layer 406 may be the same as or different from the thickness of second dielectric layer 408. It is understood that in some examples, more than one dielectric layer pairs 404 each having first and second dielectric layers 406 and 408 may be formed above and in contact with semiconductor layer 402. For example, vertically interleaved first dielectric layers 406 and second dielectric layers 408 may be formed above and in contact with semiconductor layer 402. It is also understood that in some examples, a pad layer, such as another silicon oxide layer, may be formed between dielectric layer pair(s) 404 and semiconductor layer 402.

As shown in FIG. 4B, 3D semiconductor device 400 can also include an ILD layer 410 above and in contact with dielectric layer pair 404, e.g., second dielectric layer 408 thereof. ILD layer 410 can include dielectric materials including, but not limited to, silicon oxide, silicon nitride, silicon oxynitride, low-k dielectrics, or any combination thereof. In some embodiments, ILD layer 410 includes silicon oxide. It is understood that ILD layer 410 may include multiple sublayers in some examples, such as one or more silicon oxide layers and one or more silicon nitride layers. ILD layer 410 can have a relatively large thickness compared with other ILD layers in 3D semiconductor device 400. In some embodiments in which 3D semiconductor device 400 is a memory array chip (e.g., first semiconductor structure 102 in FIG. 1), 3D semiconductor device 400 also includes a memory stack (e.g., memory stack 114 in FIG. 1, not shown in FIGS. 4A and 4B) on the same side of semiconductor layer 402 as ILD layer 410 and substantially coplanar with ILD layer 410, such that the thickness of ILD layer 410 is equal to or greater than the thickness of the memory stack. 3D semiconductor device 400 may also include channel structures (e.g., channel structures 124 in FIG. 1, not shown in FIGS. 4A and 4B) each extending vertically through the memory stack and in contact with semiconductor layer 402.

3D semiconductor device 400 can also include a plurality of contacts 412 each extending vertically through ILD layer 410 and in contact with dielectric layer pair 404. Contacts 412 can be formed in a peripheral region, such as peripheral region 204 in FIG. 2, outside of a device region in which the memory stack is formed. In some embodiments, the depth of contact 412 is nominally the same as the thickness of ILD layer 410. Each contact 412 can include one or more conductive layers, such as a metal layer (e.g., W, Co, Cu, or Al) or a silicide layer surrounded by an adhesive/barrier layer (e.g., TiN). As shown in FIG. 4A, in some embodiments, contacts 412 can include parallel wall-shaped contacts extending laterally (e.g., in the y-direction in FIG. 4A or in the x-direction in other examples). 3D semiconductor device 400 can further include an interconnect layer 414 above and in contact with contacts 412.

In some embodiments as shown in FIG. 4B, contact 412 is in contact with second dielectric layer 408 of dielectric layer pair 404 and does not extend further through second dielectric layer 408 to be in contact with first dielectric layer 406 of dielectric layer pair 404. It is understood that in some examples, contact 412 may extend through second dielectric layer 408 to be in contact with first dielectric layer 406 of dielectric layer pair 404, which is also considered as being in contact with dielectric layer pair 404 herein. It is further understood that in some examples in which multiple dielectric layer pairs 404 are formed, contact 412 may be in contact with any dielectric layer 406 or 408 of vertically interleaved first and second dielectric layers 406 and 408 of dielectric layer pairs 404. Nevertheless, contacts 412 do not extend vertically through the entire dielectric layer pair(s) 404 to be in contact with semiconductor layer 402 to avoid a short circuit between an adjacent pair of contacts 412 functioning as the capacitor electrode pair, according to some embodiments. In other words, dielectric layer pair(s) 404 can function as the landing area of contacts 412, which electrically insulates contacts 412 and semiconductor layer 402, i.e., preventing direct contact between contacts 412 and semiconductor layer 402.

As shown in FIGS. 4A and 4B, a plurality of capacitors 416 can be formed in 3D semiconductor device 400 based on components described above. In some embodiments, an adjacent pair of contacts 412 and part of ILD layer 410 laterally between the adjacent pair of contacts 412 are configured to form a capacitor responding to capacitor 300 in FIG. 3. In other words, each capacitor 416 can extend vertically through ILD layer 410 and be in contact with dielectric layer pairs 404. A voltage can be applied to the capacitor electrodes (e.g., a pair of contacts 412) of each capacitor 416 through interconnect layer 414, and electric charge can be stored in the capacitor dielectric (e.g., the part of ILD layer 410 laterally between the pair of contacts 412). The capacitance of capacitor 416 can be determined by various factors including, but not limited to, the dimensions and materials of ILD layer 410 and contacts 412.

As described above, 3D semiconductor device 400 may be a 3D memory device having on-chip capacitors 416 on the same chip on which the memory stack and channel structures are formed. For example, FIG. 5 illustrates a side view of a cross-section of an exemplary 3D memory device 500 having on-chip capacitors, according to some embodiments of the present disclosure. 3D memory device 500 may include the components of 3D semiconductor device 400 that form on-chip capacitors 416, the details of which are not repeated for ease of description. 3D memory device 500 can include a device region 503 and a peripheral region 501, in which on-chip capacitors 416 are formed, outside of device region 503.

As shown in FIG. 5, 3D memory device 500 can include a memory stack 502 in device region 503. In some embodiments, memory stack 502 may be one example of memory stack 114 in FIG. 1 and includes a plurality of conductive/dielectric layer pairs 505 each including a conductive layer 506 and a dielectric layer 504. For example, memory stack 114 may include vertically interleaved conductive layers 506 and dielectric layer 504. As described below in detail with respect to the fabrication process, dielectric layer pair 404 and conductive/dielectric layer pairs 505 are formed from the same dielectric stack (not shown) and thus, share certain common characteristics. In some embodiments, dielectric layers 504 of conductive/dielectric layer pairs 505 in device region 503 and second dielectric layer 408 of dielectric layer pair 404 in peripheral region 501 have the same dielectric material, such as silicon oxide. Conductive layers 506 of conductive/dielectric layer pairs 505 in device region 503 can include a metal, such as W, and first dielectric layer 406 of dielectric layer pair 404 in peripheral region 501 can include silicon nitride. In some embodiments, dielectric layer pair 404 in peripheral region 501 is coplanar with a respective conductive/dielectric layer pair 505 in device region 503 (i.e., the bottom conductive/dielectric layer pair 505). For example, first and second dielectric layers 406 and 408 may be coplanar with dielectric layer 504 and conductive layer 506 of the bottom conductive/dielectric layer pair 505, respectively. In some embodiments, first and second dielectric layers 406 and 408 have the same thickness as dielectric layer 504 and conductive layer 506, respectively. It is understood that in some examples in which multiple dielectric layer pairs 404 are formed, dielectric layer pairs 404 may be coplanar with a respective number of conductive/dielectric layer pairs 505 in device region 503 as well.

As shown in FIG. 5, memory stack 502 can include a staircase structure in device region 503. In some embodiments, the top layer in each level of the staircase structure (e.g., each level including one or more conductive/dielectric layer pairs 505) is conductive layer 506 for interconnection in the vertical directions. In some embodiments, every two adjacent levels of the staircase structure are offset by a nominally same distance in the vertical direction and a nominally same distance in the lateral direction. Each offset thus can form a "landing area" for interconnection with the word lines of 3D memory device 500 in the vertical direction. The offset of the edges of every two adjacent levels of the staircase structure is nominally the same, according to some embodiments.

As shown in FIG. 5, 3D memory device 500 can also include a plurality of word line contacts 508 each above and in contact with a respective conductive layer 506 (a word line) of memory stack 502 at the staircase structure. That is, the staircase structure can be a functional staircase structure used for landing word line contacts 508. As described below in detail with respect to the fabrication process, word line contacts 508 and contacts 412 may be formed by the same process and thus share the same characteristics. In some embodiments, the top ends of word line contacts 508 and contacts 412 (e.g., the ends that are in contact with interconnect layer 414) are flush with one another, i.e., being coplanar with one another. In some embodiments, word line contacts 508 and contacts 412 have the same conductive material, such as the same metal (e.g., W).

In some embodiments, dielectric layer pair 404 does not occupy the entire peripheral region 501. As shown in FIG. 5, 3D memory device 500 can further include a peripheral contact 512 extending vertically through ILD layer 410 and in contact with semiconductor layer 402. In some embodiments, peripheral contact 512 is above and in contact with semiconductor layer 402 in part of peripheral region 501 that is not occupied by dielectric layer pair 404. Thus, peripheral contact 512 may not need to extend through dielectric layer pair 404 to contact semiconductor layer 402. In some embodiments, dielectric layer pair 404 and memory stack 502 are disconnected laterally, as shown in FIG. 5. As described below in detail with respect to the fabrication process, word line contacts 508, peripheral contact 512, and contacts 412 may be formed by the same process and thus share the same characteristics. In some embodiments, the top ends of word line contacts 508, peripheral contact 512, and contacts 412 (e.g., the ends that are in contact with interconnect layer 414) are flush with one another, i.e., being coplanar with one another. In some embodiments, word line contacts 508, peripheral contact 512, and contacts 412 have the same conductive material, such as the same metal (e.g., W).

FIGS. 6A-6E illustrate fabrication processes for forming an exemplary 3D memory device having on-chip capacitors, according to various embodiments of the present disclosure. FIG. 7 illustrates a flowchart of a method 700 for forming an exemplary 3D memory device having on-chip capacitors, according to some embodiments of the present disclosure. Examples of the 3D memory device depicted in FIGS. 6A-6E and 7 include 3D memory device 500 depicted in FIG. 5. FIGS. 6A-6E and 7 will be described together. It is understood that the operations shown in method 700 are not exhaustive and that other operations can be performed as well before, after, or between any of the illustrated operations. Further, some of the operations may be performed simultaneously, or in a different order than shown in FIG. 7.

Referring to FIG. 7, method 700 starts at operation 702, in which a dielectric stack is formed above a substrate. The dielectric stack can include a plurality of dielectric layer pairs each including a first dielectric layer and a second dielectric layer different from the first dielectric layer. The substrate can be a silicon substrate.

Figure 6A:
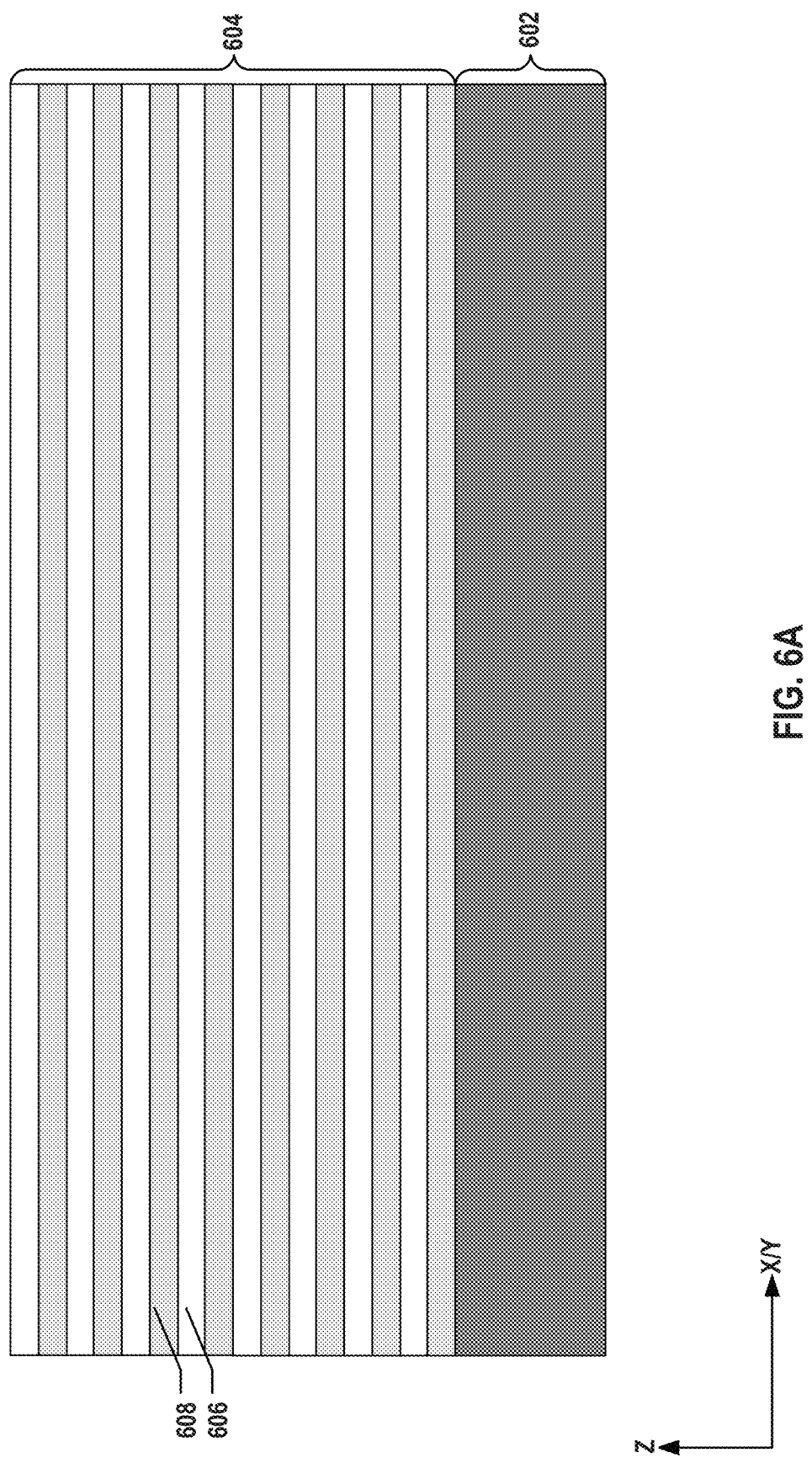
FIGS. 6A-6E illustrate fabrication processes for forming an exemplary 3D memory device having on-chip capacitors, according to various embodiments of the present disclosure.
Figure 7:
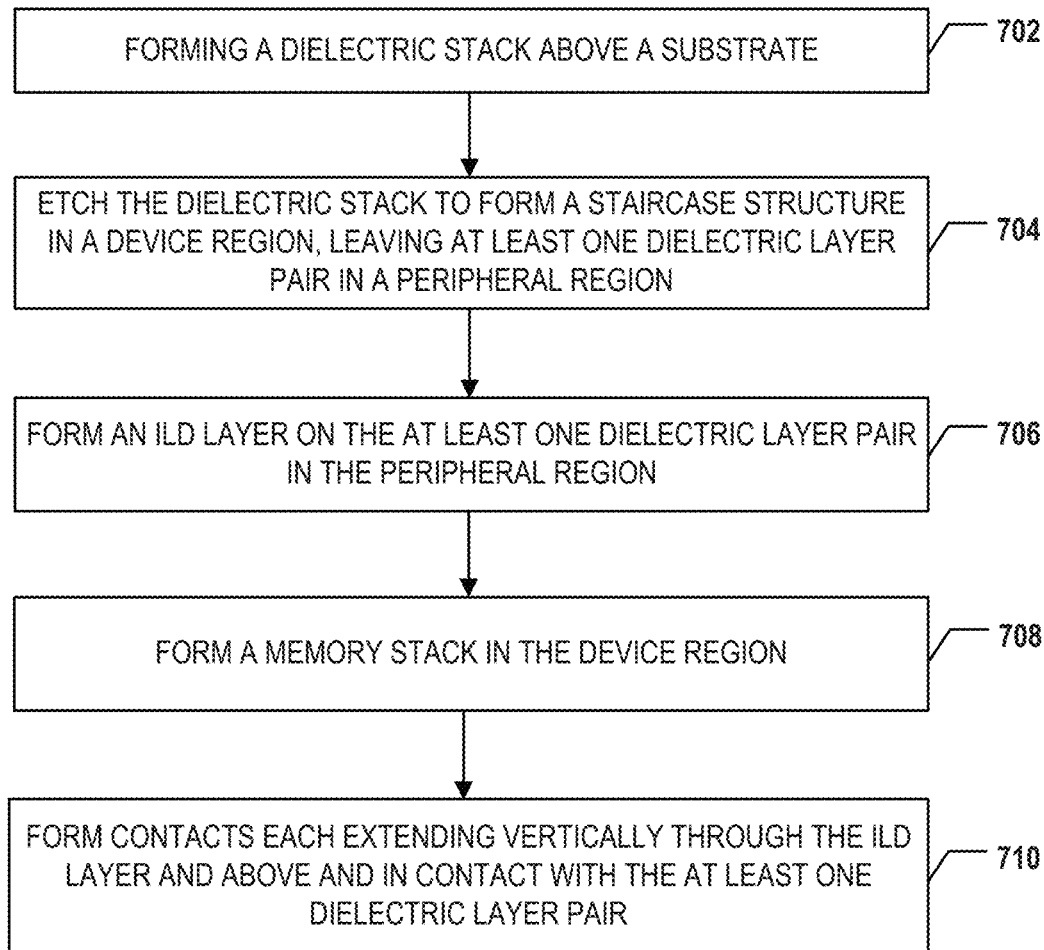
FIG. 7 illustrates a flowchart of a method for forming an exemplary 3D memory device having on-chip capacitors, according to some embodiments of the present disclosure.

As illustrated in FIG. 6A, a dielectric stack 604 including a plurality of dielectric layer pairs each including a first dielectric layer 608 and a second dielectric layer 606 (also known as sacrificial layers) is formed above a silicon substrate 602. In some embodiments, first dielectric layers 608 and second dielectric layers 606 are alternatingly deposited by one or more thin film deposition processes including, but not limited to, physical vapor deposition (PVD), chemical vapor deposition (CVD), atomic layer deposition (ALD), or any combination thereof. In some embodiments, second dielectric layers 606 include silicon nitride, and first dielectric layers 608 include silicon oxide. It is understood that the sequence of depositing second dielectric layers 606 and first dielectric layers 608 is not limited. The deposition can start with second dielectric layer 606 or first dielectric layer 608 and can end with second dielectric layer 606 or first dielectric layer 608. Although not shown, in some examples, a plurality of channel structures each extending vertically through dielectric stack 604 may be formed after the formation of dielectric stack 604 by etching a plurality of channel holes through dielectric stack 604 and depositing a memory film and semiconductor channel into the channel holes using one or more thin film deposition processes.

Method 700 proceeds to operation 704, as illustrated in FIG. 7, in which the dielectric stack is etched to form a staircase structure in a device region, leaving at least one dielectric layer pair in a peripheral region. In some embodiments, to etch the dielectric stack, a trim-etch mask is patterned on the dielectric stack, a first number of trim-etch cycles are performed using the trim-etch mask in the device region of the dielectric stack to form the staircase structure, and a second number of trim-etch cycles are performed using the trim-etch mask in the peripheral region of the dielectric stack, such that the least one dielectric layer pair remains intact in the peripheral region. In some embodiments, the first number is greater than the second number, and the difference between the first and second numbers corresponds to the number of dielectric layer pairs of the at least dielectric layer pair.

Figure 6B:
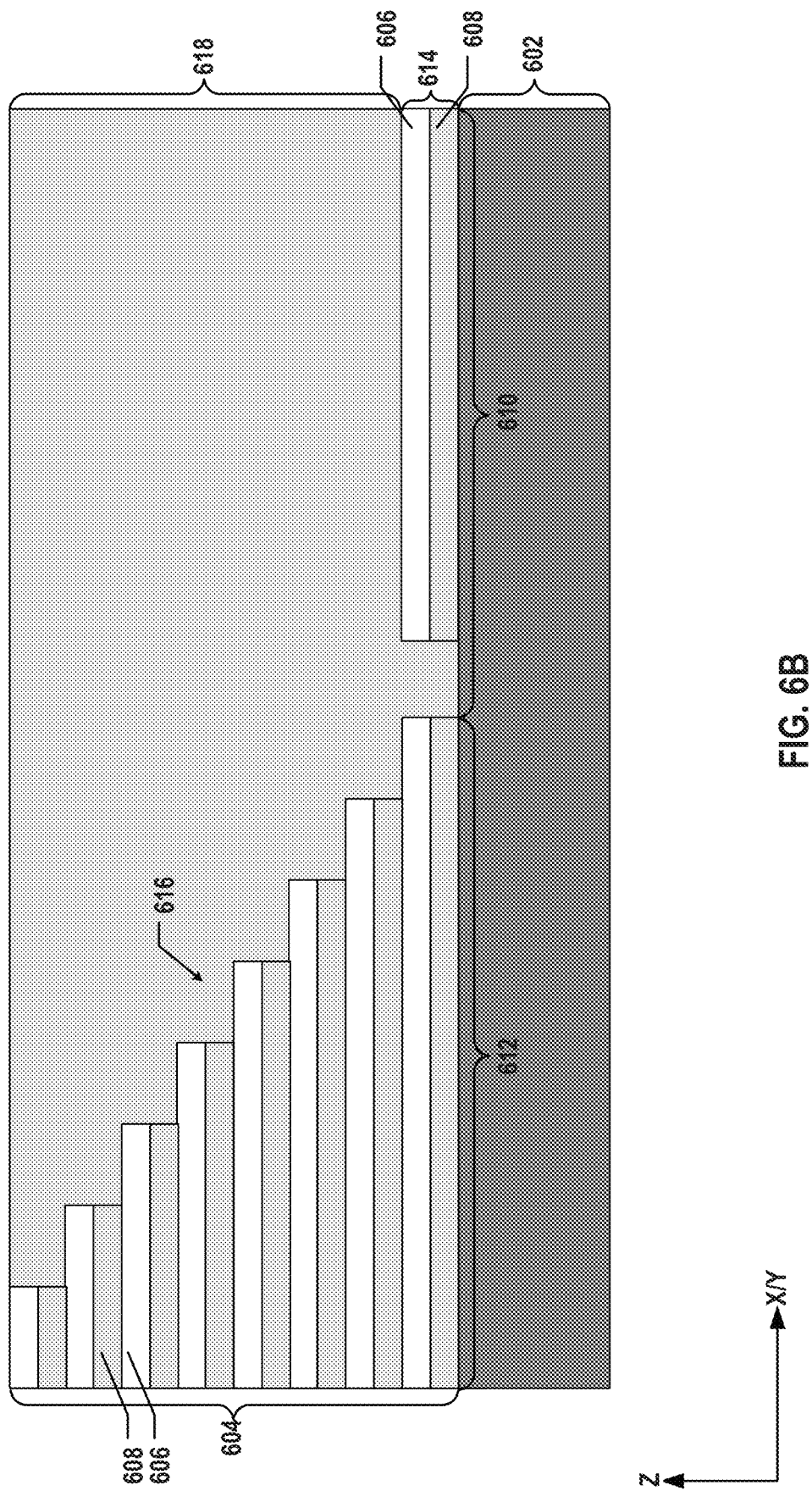

As illustrated in FIG. 6B, dielectric stack 604 is etched to form a staircase structure 616 in a device region 612, leaving a dielectric layer pair 614 including first and second dielectric layers 608 and 606 in a peripheral region 610. In some embodiments, staircase structure 616 of dielectric stack 604 and dielectric layer pair 614 in peripheral region 610 are formed by the same trim-etch process. A trim-etch process can etch a stack structure (e.g., dielectric stack 604) to form a staircase structure in the part of the stack stricture in device region 612 and at the same time, fully remove the part of the stack structure in peripheral region 610. In some embodiments, by patterning the trim-etch mask and controlling the number of trim-etch cycles applied to peripheral region 610, part of dielectric stack 604 in peripheral region 610, e.g., one or more dielectric layer pairs thereof, can remain intact in peripheral region 610 after the trim-etch process to form dielectric layer pair(s) 614 in peripheral region 610, as shown in FIG. 6B.

In some embodiments, a trim-etch mask (not shown) is patterned on dielectric stack 604. The trim-etch mask can be a soft mask (e.g., a photoresist mask), which can be trimmed in the trim-etch process for forming the stairs of staircase structure 616. In some embodiments, the trim-etch mask is formed by coating a photoresist layer on dielectric stack 604 using spin coating and patterning the coated photoresist layer using lithography and development processes. The trim-etch mask can be used as an etch mask to etch the exposed portions of dielectric stack 604. In each trim-etch cycle, the trim-etch mask can be trimmed (e.g., etched incrementally and inwardly, often from all directions), such that the opening of the trim-etch mask can be incrementally enlarged. In each trim-etch cycle, the exposed portions of dielectric stack 604 are etched, for example, by the thickness of one dielectric layer pair, using the trimmed trim-etch mask as an etch mask to form one step/level of staircase structure 616. The process can be repeated until all the steps/levels of staircase structure 616 are formed.

In some embodiments, the trim-etch mask is designed such that the number of trim-etch cycles applied to part of dielectric stack 604 in peripheral region 610 is smaller than the number of trim-etch cycles applied to part of dielectric stack 604 in device region 612 for forming staircase structure 616. As a result, one or more dielectric layer pairs 614 can remain intact in peripheral region 610 when staircase structure 616 is formed. In other words, by applying trim-etch cycles that are insufficient to fully remove all the dielectric layer pairs in peripheral region 610, one or more dielectric layer pairs 614 can remain in peripheral region 610. The number of dielectric layer pairs 614 corresponds to, for example, the same as the number of trim-etch cycles that are reduced in peripheral region 610, according to some embodiments. As shown in FIG. 6B, it is understood that the trim-etch mask may be so designed that part of dielectric stack 604 in peripheral region 610 is fully removed by etching dielectric stack 604, e.g., the trim-etch process.

Method 700 proceeds to operation 706, as illustrated in FIG. 7, in which an ILD layer is formed on the at least one dielectric layer pair in the peripheral region. The thickness of the ILD layer can be equal to or greater than a thickness of the dielectric stack.

As illustrated in FIG. 6B, an ILD layer 618 is formed on dielectric layer pair 614 in peripheral region 610. ILD layer 618 can be formed by depositing one or more dielectric layers, such as silicon oxide layers and/or silicon nitride layers, using one or more thin film deposition processes including, but not limited to, CVD, PVD, ALD, or any combination thereof. In some embodiments, ILD layer 618 is formed on staircase structure 616 of dielectric stack 604 as well. A planarization process, such as CMP, can be performed after the deposition processes to planarize the top surface of ILD layer 618. In some embodiments, the planarization process stops at the top surface of dielectric stack 604 such that the thickness of ILD layer 618 is nominally the same as the thickness of dielectric stack 604.

Method 700 proceeds to operation 708, as illustrated in FIG. 7, in which the second dielectric layers in a remainder of the dielectric stack in the device region are replaced with conductive layers to form a memory stack in the device region. In some embodiments, the at least one dielectric layer pair in the peripheral region remains intact after replacing the first dielectric layers with the conductive layers.

Figure 6C:
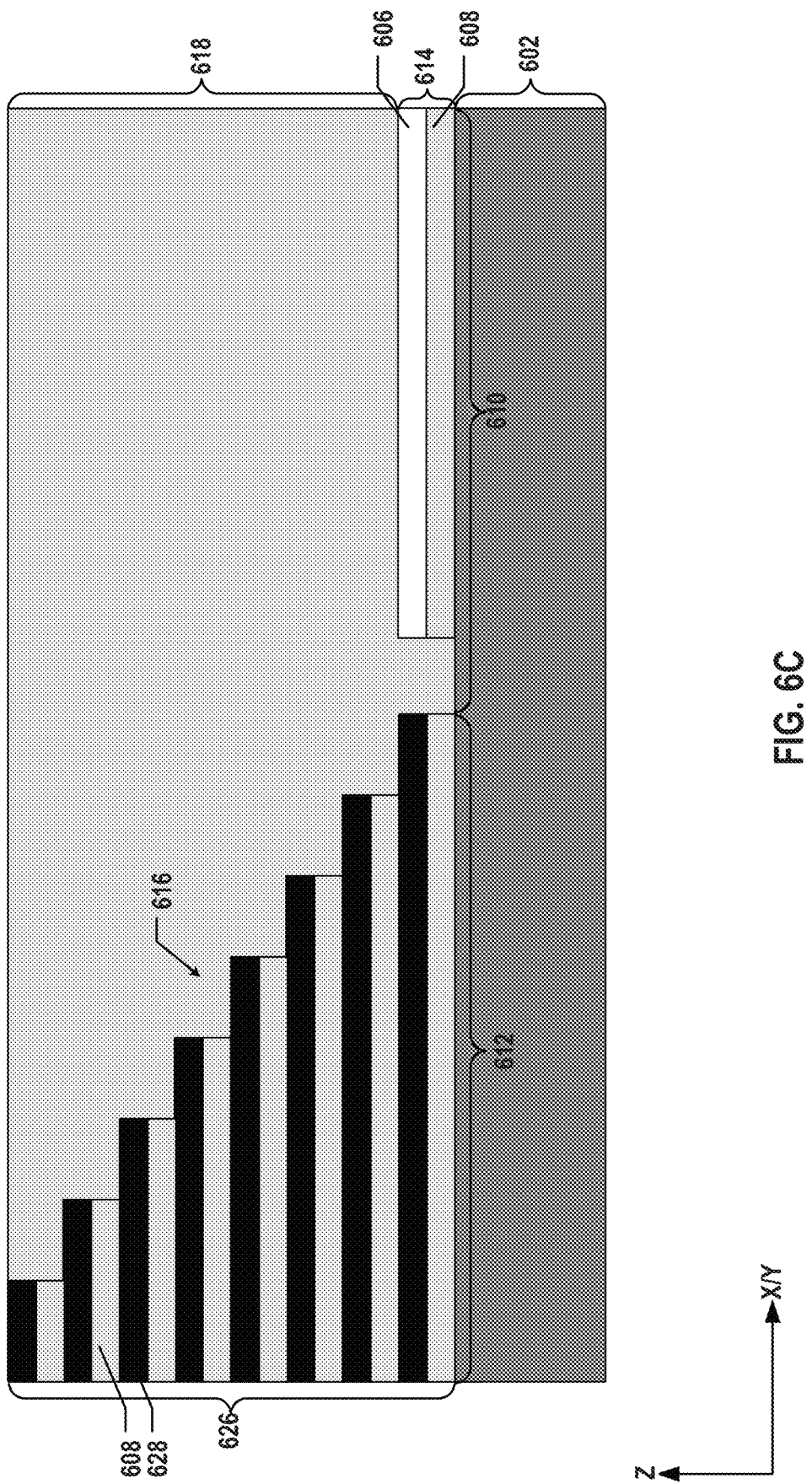

As illustrated in FIG. 6C, a memory stack 626 is formed in device region 612 to replace the remainder of dielectric stack 604 (shown in FIG. 6B) including staircase structure 616 in device region 612 using a gate-replacement process. Memory stack 626 can include a plurality of conductive/dielectric layer pairs each including first dielectric layer 608 and a conductive layer 628. During the gate-replacement process, openings (e.g., slits, not shown) can be formed through the remainder of dielectric stack 604, which can be used as the passageways for replacing second dielectric layers 606 (shown in FIG. 6B) in the remainder of dielectric stack 604 with conductive layers 628. The replacement of second dielectric layers 606 with conductive layers 628 can be performed by wet etching second dielectric layers 606 (e.g., silicon nitride) selective to first dielectric layers 608 (e.g., silicon oxide) and filling the resulting lateral recesses with conductive layers 628 (e.g., W). Conductive layers 628 can be deposited by PVD, CVD, ALD, or any combination thereof.

In some embodiments, the gate-replacement process applied in device region 612 does not affect dielectric layer pair 614 in peripheral region 610, such that dielectric layer pair 614 remains intact after the formation of memory stack 626. Nevertheless, as dielectric layer pair 614 in peripheral region 610 and memory stack 626 in device region 612 are both formed from the same dielectric stack 604 using the same trim-etch process, dielectric layer pair 614 in peripheral region 610 and memory stack 626 in device region 612 can still share some characteristics. In one example, dielectric layer pair 614 may be coplanar with the bottom conductive/dielectric layer pair 628/608 of memory stack 626. In another example, dielectric layer pair 614 and conductive/dielectric layer pair 628/608 may include the same first dielectric layer 608. One the other hand, since the gate-replacement process does not apply to dielectric layer pair 614 in peripheral region 610, dielectric layer pair 614 and conductive/dielectric layer pair 628/608 also have different second dielectric layer 606 and conductive layer 628, according to some embodiments.

Method 700 proceeds to operation 710, as illustrated in FIG. 7, in which a plurality of first contacts each extending vertically through the ILD layer are formed above and in contact with the at least one dielectric layer pair. In some embodiments, the plurality of first contacts include a plurality of parallel wall-shaped contacts. In some embodiments, in the same process for forming the plurality of first contacts, a plurality of second contacts each above and in contact with a respective one of the conductive layers of the memory stack at the staircase structure are formed. In some embodiments, in the same process for forming the plurality of first contacts, a third contact is formed above and in contact with the substrate in the peripheral region.

Figure 6D:
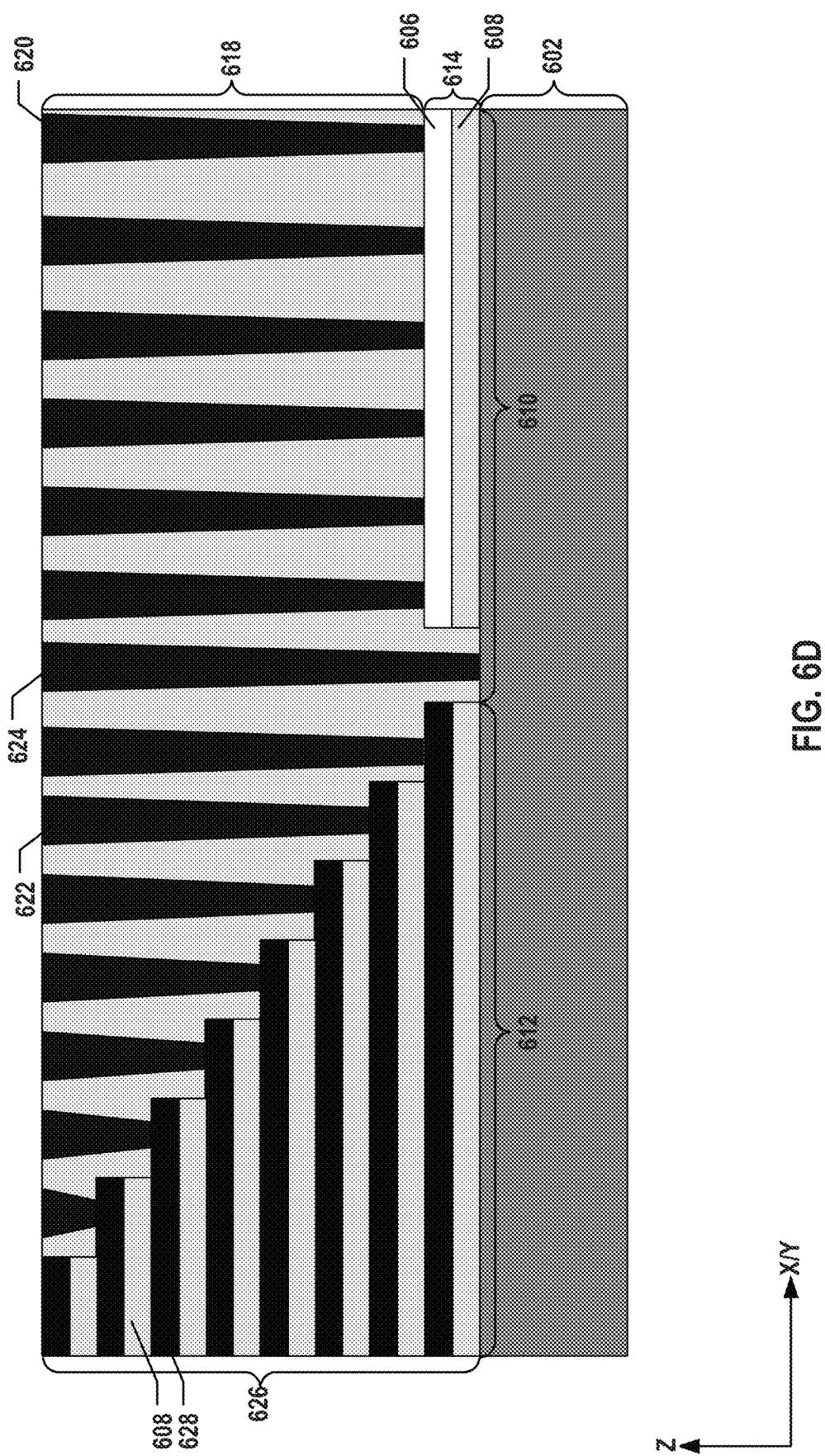

As illustrated in FIG. 6D, contacts 620 are formed extending vertically through ILD layer 618 to be above and in contact with dielectric layer pair 614 in peripheral region 610. In some embodiments, word line contacts 622 are formed above and in contact with conductive layers 628 of memory stack 626 in staircase structure 616, and peripheral contacts 624 are formed extending vertically through ILD layer 618 to be above and in contact with silicon substrate 602 in peripheral region 610 as well. To form contacts 620, 622, and 624, contact openings, such as trenches, are first etched through ILD layer 618 using dry etching and/or wet etching, such as reactive ion etch (RIE), stopped at dielectric layer pair 614, silicon substrate 602, and conductive layers 628, respectively, according to some embodiments. It is understood that in some examples, the etching of contact openings may not stop at the top layer of dielectric layer pair(s) 614 and may extend further into dielectric layer pair(s) 614 as long as it does not reach to silicon substrate 602. Conductive materials then can be deposited, using one or more thin film deposition processes including, but not limited to, CVD, PVD, ALD, or any combination thereof, into the contact openings to form an adhesive/barrier layer and a contact core filling each contact opening. In some embodiments, a planarization process, such as etching and/or CMP, is performed to remove the excess conductive materials and planarize the top surfaces of ILD layer 618, memory stack 626, and contacts 620, 622, and 624, such that the upper ends of contacts 620, 622, and 624 are flush with one another.

Figure 6E:
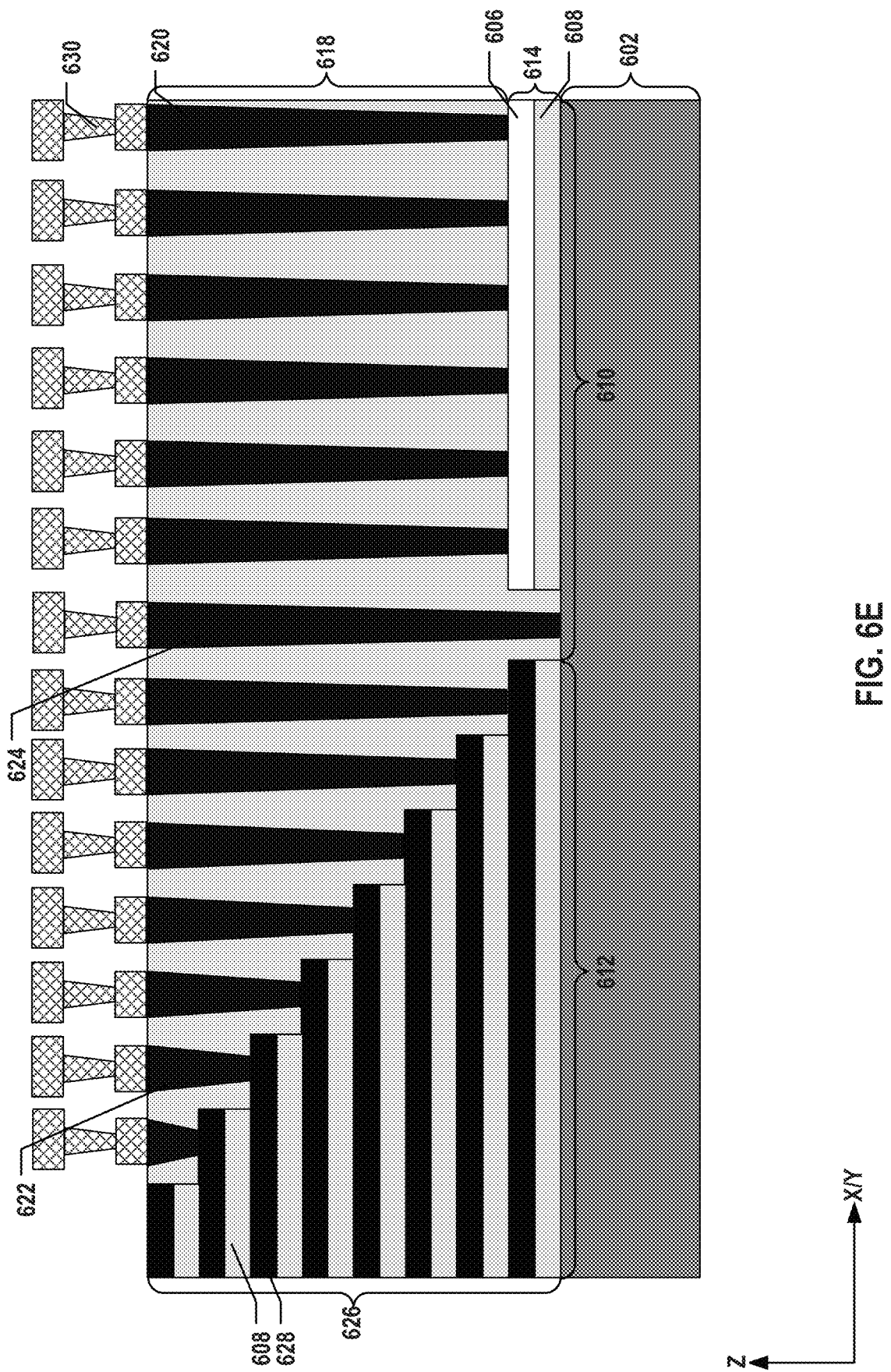

As illustrated in FIG. 6E, an interconnect layer 630 is formed above and in contact with contacts 620, 622, and 624. Another ILD layer (not shown) can be formed on ILD layer 618 by depositing dielectric materials, such as silicon oxide or silicon nitride, using one or more thin film deposition processes, such as CVD, PVD, ALD, or any combination thereof, on top of ILD layer 618 and memory stack 626. Interconnects can be formed by etching contact openings through the ILD layer using wet etching and/or dry etching, e.g., RIE, followed by filling the contact openings with conductive materials using one or more thin film deposition processes, such as ALD, CVD, PVD, any other suitable processes, or any combination thereof.

According to one aspect of the present disclosure, a semiconductor device includes at least one dielectric layer pair including a first dielectric layer and a second dielectric layer different from the first dielectric layer, an ILD layer in contact with the at least one dielectric layer pair, and one or more capacitors each extending vertically through the ILD layer and in contact with the at least one dielectric layer pair.

In some embodiments, at least one of the capacitors is electrically connected to a power line and a ground of the semiconductor device.

In some embodiments, the capacitors are disposed in a peripheral region of the semiconductor device.

In some embodiments, the capacitors include a plurality of first contacts each extending vertically through the ILD layer and in contact with the at least one dielectric layer pair.

In some embodiments, the plurality of first contacts include a plurality of parallel wall-shaped contacts.

In some embodiments, the at least one dielectric layer pair includes a plurality of dielectric layer pairs each including the first dielectric layer and the second dielectric layer.

In some embodiments, the plurality of dielectric layer pairs include vertically interleaved the first dielectric layers and the second dielectric layers.

In some embodiments, the first and second dielectric layers include silicon oxide and silicon nitride, respectively.

In some embodiments, the semiconductor device further includes a memory stack including a plurality of conductive/dielectric layer pairs each including a conductive layer and the first dielectric layer, and a plurality of channel structures each extending vertically through the memory stack. The plurality of contacts can be disposed in a peripheral region outside of the memory stack.

In some embodiments, a thickness of the ILD layer is equal to or greater than a thickness of the memory stack.

In some embodiments, the at least one dielectric layer pair is coplanar with at least one of the conductive/dielectric layer pairs of the memory stack.

In some embodiments, the memory stack includes a staircase structure, and the semiconductor device further includes a plurality second contacts each in contact with a respective one of the conductive layers of the memory stack at the staircase structure.

In some embodiments, one ends of the first and second contacts are flush with one another.

According to another aspect of the present disclosure, a 3D memory device includes a semiconductor layer, a memory stack on one side of the semiconductor layer, and a plurality of first contacts disposed in a peripheral region of the 3D memory device outside of the memory stack. The memory stack includes a plurality of conductive/dielectric layer pairs each including a conductive layer and a first dielectric layer.

In some embodiments, the peripheral region is at an edge of the 3D memory device in which contact pads of the 3D memory device are disposed.

In some embodiments, the 3D memory device further includes an ILD layer in contact with the at least dielectric layer pair, wherein each of the first contacts extends vertically through the ILD layer.

In some embodiments, an adjacent pair of the first contacts and part of the ILD layer between the adjacent pair of the first contacts are configured to form a capacitor.

In some embodiments, the capacitor is electrically connected to a power line and a ground of the 3D memory device.

In some embodiments, a thickness of the ILD layer is equal to or greater than a thickness of the memory stack.

In some embodiments, the 3D memory device further includes at least one dielectric layer pair on the same side of the semiconductor layer as the memory stack. In some embodiments, the at least one dielectric layer pair includes the first dielectric layer and a second dielectric layer different from the first dielectric layer, and the plurality of first contacts are in contact with the at least dielectric layer pair.

In some embodiments, the at least one dielectric layer pair is coplanar with at least one of the conductive/dielectric layer pairs of the memory stack.

In some embodiments, the memory stack includes a staircase structure, and the 3D memory device further includes a plurality second contacts each in contact with a respective one of the conductive layers of the memory stack at the staircase structure.

In some embodiments, the conductive layers include a metal, the first dielectric layers include silicon oxide, and the second dielectric layers include silicon nitride.

In some embodiments, the 3D memory device further includes a plurality of peripheral circuits and a bonding interface between the peripheral circuits and the memory stack.

In some embodiments, the plurality of first contacts are electrically connected to at least one of the peripheral circuits, According to still another aspect of the present disclosure, a method for forming a 3D memory device is disclosed. A dielectric stack is formed above a substrate. The dielectric stack includes a plurality of dielectric layer pairs each including a first dielectric layer and a second dielectric layer different from the first dielectric layer. The dielectric stack is etched to form a staircase structure in a device region, leaving at least one dielectric layer pair in a peripheral region. An ILD layer is formed on the at least one dielectric layer pair in the peripheral region. A plurality of first contacts each extending vertically through the ILD layer are formed above and in contact with the at least one dielectric layer pair.

In some embodiments, the plurality of first contacts include a plurality of parallel wall-shaped contacts.

In some embodiments, to etch the dielectric stack, a trim-etch mask is patterned on the dielectric stack, and a first number of trim-etch cycles and a second number of trim-etch cycles are performed, using the trim-etch mask, in the device region of the dielectric stack to form the staircase structure and in the peripheral region of the dielectric stack, such that the least one dielectric layer pair remains intact in the peripheral region.

In some embodiments, the first number is greater than the second number, and a difference between the first and second numbers corresponds to a number of dielectric layer pairs of the at least dielectric layer pairs.

In some embodiments, after etching the dielectric stack, the second dielectric layers in a remainder of the dielectric stack in the device region are replaced with conductive layers to form a memory stack in the device region.

In some embodiments, the at least one dielectric layer pair in the peripheral region remains intact after replacing the first dielectric layers with the conductive layers.

In some embodiments, a thickness of the ILD layer is equal to or greater than a thickness of the memory stack.

In some embodiments, a plurality of second contacts each above and in contact with a respective one of the conductive layers of the memory stack are formed at the staircase structure in a same process for forming the plurality of first contacts.

In some embodiments, the conductive layers include a metal, the first dielectric layers include silicon oxide, and the second dielectric layers include silicon nitride.

In some embodiments, etching the dielectric stack fully removes part of the dielectric stack in the peripheral region.

In some embodiments, a third contact above and in contact with the substrate is formed in the peripheral region in a same process for forming the plurality of first contacts.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A semiconductor device, comprising:
   a substrate;
   at least one dielectric layer pair in contact with the substrate, comprising a first dielectric layer and a second dielectric layer different from the first dielectric layer;
   an interlayer dielectric (ILD) layer in contact with the at least one dielectric layer pair;
   one or more capacitors each extending vertically through the ILD layer and in contact with the at least one dielectric layer pair;
   a memory stack comprising a plurality of conductive/dielectric layer pairs each comprising a conductive layer and the first dielectric layer; and
   a plurality of channel structures each extending vertically through the memory stack,
      wherein the capacitors include a plurality of first contacts each extending vertically through the ILD layer and in contact with the at least one dielectric layer pair,
      the plurality of first contacts are disposed in a peripheral region outside of the memory stack,
      the memory stack comprises a staircase structure, and
      the semiconductor device further comprises a plurality second contacts each in contact with a respective one of the conductive layers of the memory stack at the staircase structure.

2. The semiconductor device of claim 1, wherein at least one of the capacitors is electrically connected to a power line and a ground of the semiconductor device.

3. The semiconductor device of claim 1, wherein the capacitors are disposed in a peripheral region of the semiconductor device.

4. The semiconductor device of claim 1, wherein the plurality of first contacts comprise a plurality of parallel wall-shaped contacts.

5. The semiconductor device of claim 1, wherein the at least one dielectric layer pair comprises a plurality of dielectric layer pairs each comprising the first dielectric layer and the second dielectric layer.

6. The semiconductor device of claim 5, wherein the plurality of dielectric layer pairs comprise vertically interleaved the first dielectric layers and the second dielectric layers.

7. The semiconductor device of claim 1, wherein the first and second dielectric layers comprise silicon oxide and silicon nitride, respectively.

8. The semiconductor device of claim 1, wherein a thickness of the ILD layer is equal to or greater than a thickness of the memory stack.

9. The semiconductor device of claim 1, wherein the at least one dielectric layer pair is coplanar with at least one of the conductive/dielectric layer pairs of the memory stack.

10. The semiconductor device of claim 1, wherein one ends of the first and second contacts are flush with one another.

11. A semiconductor device, comprising:
a semiconductor layer;
a memory stack on a side of the semiconductor layer, the memory stack comprising a plurality of conductive/dielectric layer pairs each comprising a conductive layer and a first dielectric layer;
a dielectric layer pair on the side of the semiconductor layer; and
a plurality of first contacts on the dielectric layer pair in contact with the dielectric layer pair,
wherein the dielectric layer pair is coplanar with a respective conductive/dielectric layer pair of the plurality of conductive/dielectric layer pairs.

12. The semiconductor device of claim 11, further comprising:
an interlayer dielectric (ILD) layer in contact with the semiconductor layer, the memory stack, and the dielectric layer pair.

13. The semiconductor device of claim 12, further comprising:
one or more capacitors each extending vertically through the ILD layer and in contact with the dielectric layer pair.

14. The semiconductor device of claim 13, wherein the capacitors are disposed in a peripheral region of the semiconductor device.

15. The semiconductor device of claim 13, wherein the capacitors include a plurality of first contacts each extending vertically through the ILD layer and in contact with the dielectric layer pair.

* * * * *